United States Patent [19]
Huang et al.

[11] Patent Number: 5,736,450
[45] Date of Patent: Apr. 7, 1998

[54] METHOD FOR FORMING A CYLINDRICAL CAPACITOR

[75] Inventors: Julie Huang; Eric Wang, both of Chinchu, Taiwan

[73] Assignee: Taiwan Semiconductor Manufacturing Company, Ltd., Hsinchu, Taiwan

[21] Appl. No.: 877,984

[22] Filed: Jun. 18, 1997

[51] Int. Cl.[6] .................................................. H01L 21/20
[52] U.S. Cl. .................. 438/396; 438/397; 438/253; 438/254; 438/738; 148/DIG. 14
[58] Field of Search ........................... 438/253, 254, 438/255, 396, 397, 398, 738, 745; 148/DIG. 14

[56] References Cited

U.S. PATENT DOCUMENTS

| | | | |
|---|---|---|---|
| 5,273,925 | 12/1993 | Yamanaka | 437/52 |
| 5,387,533 | 2/1995 | Kim | 438/396 |
| 5,403,767 | 4/1995 | Kim | 437/52 |
| 5,436,187 | 7/1995 | Tanigawa | 437/52 |
| 5,506,164 | 4/1996 | Kinoshita et al. | 437/52 |
| 5,543,346 | 8/1996 | Keum et al. | 438/397 |
| 5,550,076 | 8/1996 | Chen | 438/396 |
| 5,663,092 | 9/1997 | Lee | 438/253 |
| 5,668,038 | 9/1997 | Huang et al. | 438/397 |

*Primary Examiner*—Tuan H. Nguyen
*Attorney, Agent, or Firm*—George O. Saile; Stephen B. Ackerman

[57] ABSTRACT

An improved process for fabricating cylindrical capacitors for use in DRAMs is described wherein the silicon nitride etch stop layer is eliminated. The etch stop layer is normally used to halt etching during the formation of the dielectric cylinder that is used as a substrate on which the cylindrical electrode gets built. If etching is allowed to proceed, the underlying dielectric layer on which the cylinder rests will also be removed. In place of the etch stop layer, the present invention calls for two dielectric layers that have generally similar properties in other respects but substantially different etch rates. For the fast etching dielectric, $O_3$TEOS is used while, for the slow etching dielectric, BPTEOS is used. When etched in 10:1 BOE a differential etch rate of about 10 times is obtained so that formation of a $O_3$TEOS cylindrical substrate can be completed without significantly eroding the underlying BPTEOS support layer.

19 Claims, 3 Drawing Sheets

5,736,450

METHOD FOR FORMING A CYLINDRICAL CAPACITOR

BACKGROUND OF THE INVENTION (1) Field of the Invention

The invention relates to the general field of integrated circuits, more particularly to improved methods for forming cylindrical capacitors.

(2) Description of the Prior Art

Dynamic Random Access Memories (DRAMs) are commonly implemented as integrated circuits. An integral part of a DRAM are storage capacitors, one of which is associated with each bit of information that is to be stored and/or read. These capacitors have typical capacitance values of about 75 fF or less per cell, which allows them to be formed in situ together with other components such as diodes and transistors. In order to minimize the amount of real estate occupied by the capacitors it has become routine to depart from a simple flat plate geometry and to give them a three dimensional aspect such as, for example, a hollow cylinder.

Since the DRAM capacitors are formed as part of a larger process (as opposed to being free standing entities) any reduction in the number of steps needed to form them leads to a reduction in the cost of the DRAM. The present invention is concerned with such a process simplification and, as will be seen, some additional side benefits also result.

In order to form electrodes of the type just described, some sort of solid cylindrical pedestal must first be formed to serve as a substrate around which a hollow cylinder can be fashioned. Most commonly, this solid cylinder is formed from a dielectric layer which itself rests on another, very similar, dielectric layer. This presents a problem of how to stop the etching of the first dielectric layer once the level of the second dielectric layer has been reached. A solution to this, often described in the prior art, is to insert an etch stop layer (usually silicon nitride) between the two dielectric layers (usually silicate type glass). While this solution works, it increases the cost of the overall process and, additionally, introduces the possibility of stress related cracking resulting from the presence of the silicon nitride.

As examples of the prior art that teach the use of etch stop layers during DRAM capacitor formation we may mention Kim (U.S. Pat. No. 5,403,767 Apr 1995) and Kinoshita et al. (U.S. Pat. No. 5,506,164 Apr 1996).

A somewhat different approach has been taken by Yamanaka (U.S. Pat. No. 5,273,925 Dec 1993) who uses two conductive layers to provide the substrate on which the hollow cylindrical electrode gets formed. A dielectric material is then used for the etch stop layer. Mention is also made of the possibility of using two conductive materials that react differently to the etchant so that etching stops automatically when the second conductive layer is reached by the etchant.

The possibility of using two dielectric layers that react differently to the same etchant has been mentioned by Keum et al. (U.S. Pat. No. 5,543,346 Aug 1996) and by Tanigawa (U.S. Pat. No. 5,436,187 Jul 1995). Keum mentions a combination silicon oxide/silicon nitride film and/or a boron-phophorus tetra ethyl ortho silicate (BPTEOS) film for the slow etching layer. No specifics are given as to what could be used for the fast etching layer, only that it etches significantly faster. Tanigawa refers to his fast etching layer as 'a silicon oxide' while the slow etching layer is 'other than a silicon oxide', no further details being offered.

The present invention also teaches the use of two similar dielectric layers without the need for an etch stop layer, but specific information as to their composition and method of depostion is also provided. Additionally, and most importantly, both dielectric layers are silicate glasses so that no departure from the standard DRAM fabrication process is required in order to make use of the selective etching feature.

SUMMARY OF THE INVENTION

It has been an object of the present invention to provide a process for manufacturing a cylindrical electrode.

Another object of the present invention has been to provide a process for manufacturing a cylindrical electrode and capacitor for use within a DRAM structure.

A still further object has been that said process be fully compatible with existing methods for manufacturing DRAMs, introducing no additional process steps or mechanical stress.

These objects have been achieved by eliminating the silicon nitride etch stop layer that is normally used to halt etching during the formation of the dielectric cylinder that is used as a substrate on which the cylindrical electrode gets built. If etching is allowed to proceed, the underlying dielectric layer on which the cylinder rests will also be removed. In place of the etch stop layer, the present invention calls for two dielectric layers that have generally similar properties in other respects but substantially different etch rates. For the fast etching dielectric, $O_3TEOS$ is used while, for the slow etching dielectric, BPTEOS is used. When etched in 10:1 buffered oxide etch solution [91% ammonium fluoride (40% strength) and 9% hydrofluoric acid (49% strength)], a differential etch rate of about 10 times is obtained so that formation of a $O_3TEOS$ cylindrical substrate can be completed without significantly eroding the underlying BPTEOS support layer.

DESCRIPTION OF THE PREFERRED EMBODIMENTS

The first embodiment of the present invention is not limited to the formation of cylindrical capacitors but, rather, teaches how a glassy silicate film that has been deposited onto a similar glassy silicate film may be etched, with etching stopping or slowing considerably, when the etchant reaches the second film. It is key to the spirit of the present invention that both films are such that they are chosen for use in the overall process for reasons over and above their different behaviors when exposed to the same etchant. Thus, the selection of these materials introduces no new steps or material costs into the process.

For the lower, slower etching, layer BPTEOS is used. The composition of the layer is approximately 3 to 5% P, 3 to 5% B, and 90 to 94% $SiO_2$. It is deposited by sub atmospheric chemical vapor deposition (SACVD). Thicknesses for this layer are in the range of from about 7,000 to 9,000 microns. For the upper, fast etching, dielectric layer ozone tetra ethyl orthosilicate ($O_3TEOS$) is used. The composition of this layer is approximately the same as BPTEOS but without the B-P doping. It is deposited by SACVD. Thicknesses for this layer are in the range of from about 3,000 to 5,000 microns. When etched in 10:1 buffered oxide etch at a temperature between about 80° and 120° C., the $O_3TEOS$ will etch at a rate that is approximately 10 times faster than the BPTEOS. This allows ample time for etching of the O₃TEOS to be terminated before any significant erosion of the BPTEOS can occur.

For the second embodiment we describe a process for forming a cylindrical capacitor that incorporates the process of the first embodiment. It is important to note that, while the process is described as though it were a standalone process limited to the formation of a capacitor, all the steps described are steps that are also used for other purposes as part of the manufacture of a DRAM. Thus, the incorporation of our specific process does not add to the cost of manufacturing a DRAM.

The process begins with the provision of a silicon substrate. In general, such a substrate would be a partially completed integrated circuit with partially or fully completed components such as diodes, transistors, and areas of field oxide already in place.

Figure 1:
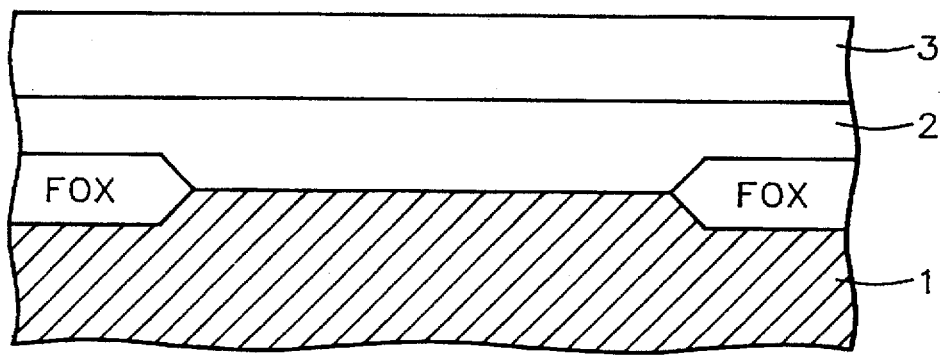
FIGS. 1 through 5 show a series of cross-sections that illustrate successive steps in the process of the present invention, notably the formation of a cylindrical electrode.

Referring now to FIG. 1, a cross-section of silicon substrate 1 is depicted, including areas of field oxide at each end. Insulating layer 2, consisting of BPTEOS, is deposited over both the silicon substrate and field oxide to a thickness between about 4,000 and 6,000 microns. This is followed by the deposition of insulating layer 3 of BPTEOS. The method used for the deposition of the BPTEOS is SACVD and it is deposited to a thickness between about 3,000 and 4,000 microns.

Figure 2:
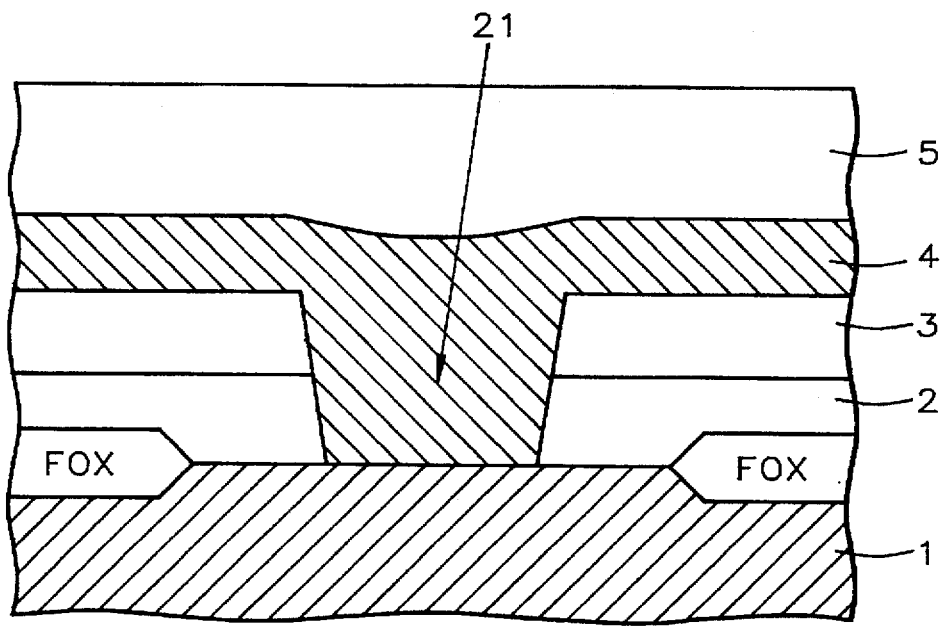

Referring now to FIG. 2, contact hole 21 is etched, through both insulating layers 2 and 3, down to the level of silicon substrate 2 in a region between the areas of field oxide. The diameter of the contact hole is between about 0.35 and 0.4 microns. Then, polysilicon layer 4 is deposited to a thickness between about 2,000 and 2,500 microns which is sufficient to overfill contact hole 21 so that layer 4 covers layer 3 as well as filling contact hole 21. Then, layer 5 of O₃TEOS is deposited over the entire structure to a thickness between about 3,000 and 5,000 microns. Deposition of the O₃TEOS is achieved by SACVD at a pressure of about 450 torr and a temperature of about 400° C.

Figure 3:
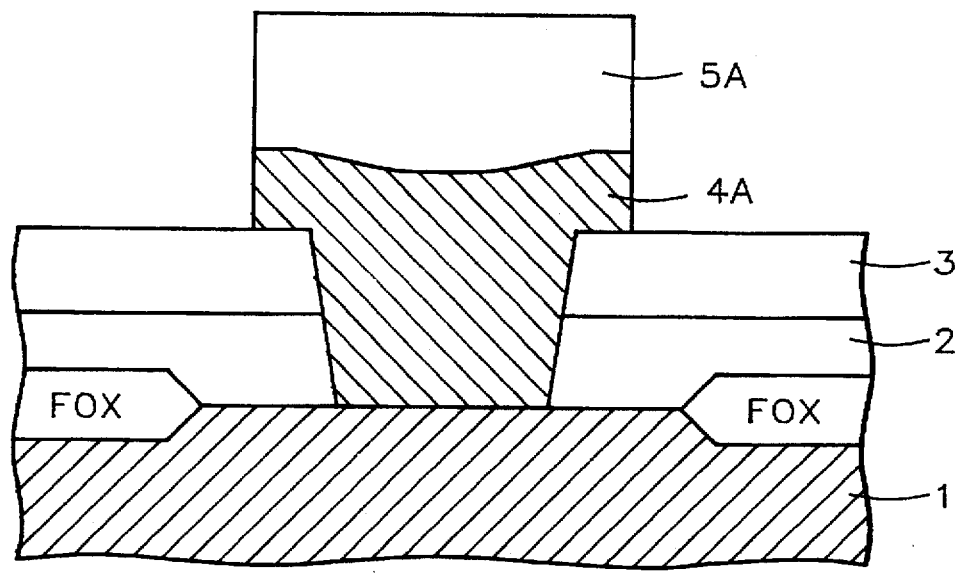

Turning now to FIG. 3, a photoresist pattern (not shown) is formed on the O₃TEOS layer (layer 5 in FIG. 2) such that when the unprotected portions of layer 5 are removed cylindrical pedestal 4A-5A results. A two step etching procedure is used whereby etching proceeds at a rapid rate through O₃TEOS layer 5 as well as through polysilicon layer 4 but slows down when the BPTEOS is reached.

Figure 4:
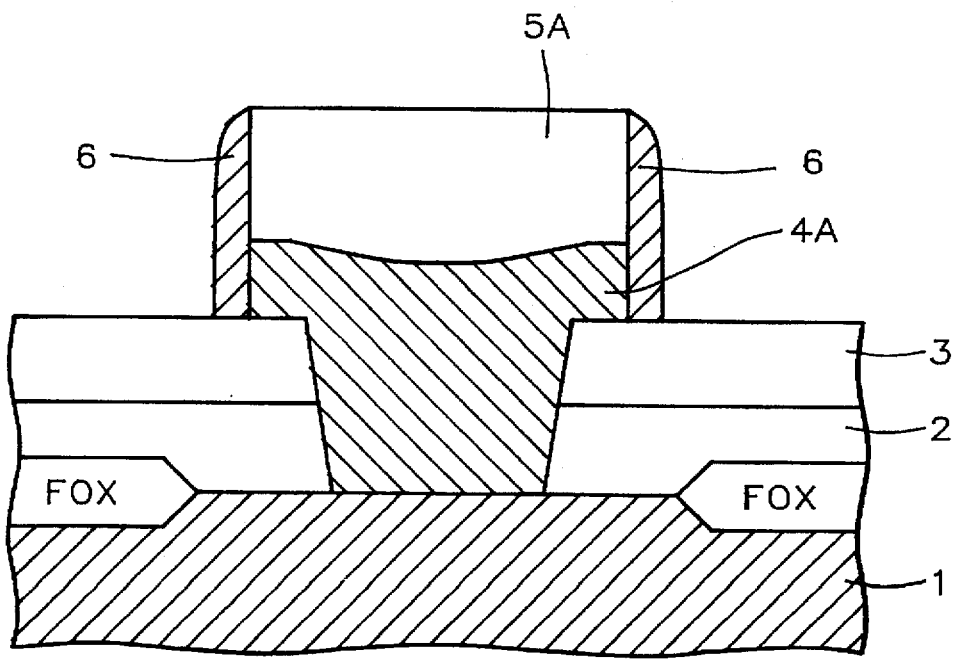

After the photoresist has been removed, polysilicon layer 6 is deposited onto the vertical sidewalls of cylindrical pedestal 4A-5A as seen in FIG. 4. To limit the polysilicon coating to the sidewalls, it is initially deposited in an isotropic manner so as to cover all surfaces. This is followed by an anisotropic etch that removes the polysilcon from all horizontal surfaces but leaves it in place on the vertical surfaces. Typical thickness for this polysilicon layer is between about 1,000 and 2,000 microns.

Figure 5:
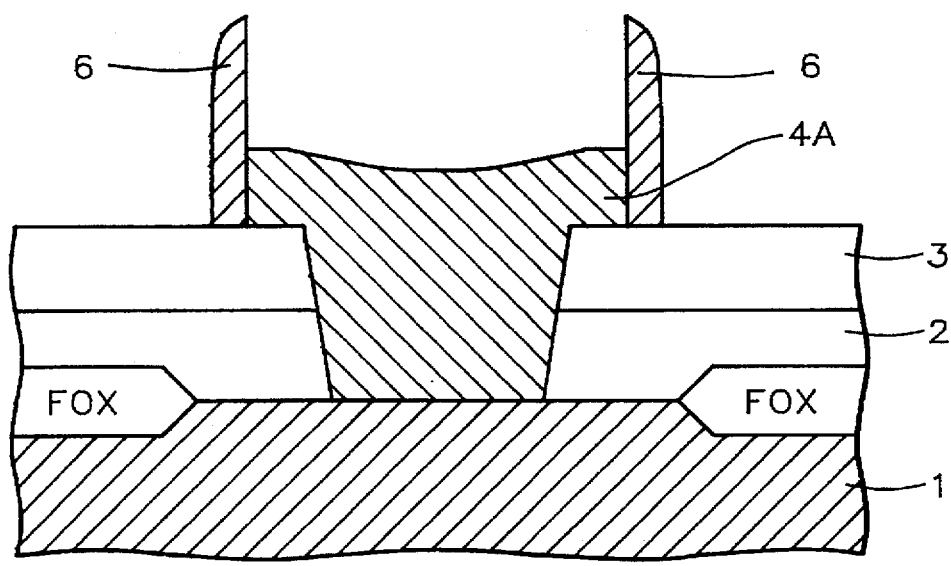

The final step for the formation of the cylindrical electrode 6 is to remove layer 5A of O₃TEOS giving the structure the appearance shown in FIG. 5. This is done by etching in 10:1 buffered oxide etch for about 5 to 8 minutes at temperature between about 80° and 120° C. To complete the fabrication of the full capacitor, a conformal layer of a dielectric such as ONO (silicon oxide-silicon nitride-silicon oxide) or NO (silicon nitride-silicon oxide) is deposited over all exposed surfaces of cylinder 6 followed by a counter electrode of a suitable material such polysilicon.

While the invention has been particularly shown and described with reference to the preferred embodiments thereof, it will be understood by those skilled in the art that various changes in form and details may be made without departing from the spirit and scope of the invention.

What is claimed is:

1. A method for forming a cylindrical capacitor, comprising the sequential steps of:

(a) providing a silicon substrate, including areas of field oxide;

(b) depositing a first insulating layer on said silicon substrate and field oxide;

(c) depositing a second insulating layer, of BPTEOS, on said first insulating layer;

(d) etching a contact hole, in a region between said areas of field oxide, extending through the first and second insulating layers to the level of the silicon substrate;

(e) depositing a first layer of polysilicon to a thickness sufficient to overfill said contact hole whereby a portion of said first polysilicon layer covers said layer of BPTEOS;

(f) depositing a layer of O₃TEOS over said first layer of polysilicon;

(g) protecting part of said layer of O₃TEOS with a patterned layer of photoresist and then etching said layer of O₃TEOS and said first layer of polysilicon, using an etchant which etches the layer of O₃TEOS about 10 times faster than said layer of BPTEOS, thereby allowing etching to be terminated after removal of only a small amount of BPTEOS and forming a cylindrical pedestal, having vertical sides, that projects away from the layer of BPTEOS;

(h) removing the photoresist;

(i) depositing and then etching a second polysilicon layer on said pedestal so as to coat only said vertical sides; and (j) removing the layer of O₃TEOS thereby forming a hollow cylinder suitable for use as a capacitor electrode.

2. The method of claim 1 wherein said first insulating layer is BPTEOS or BPSG.

3. The method of claim 1 wherein said first insulating layer is deposited to a thickness between about 4,000 and 6,000 microns.

4. The method of claim 1 wherein said layer of BPTEOS is deposited to a thickness between about 2,000 and 3,000 microns.

5. The method of claim 1 wherein said layer of BPTEOS is deposited using SACVD at a pressure between about 180 to 220 torr, a temperature between about 450° to 500° C., and a doping level of boron and phosphorus between about 3 and 5%.

6. The method of claim 1 wherein the diameter of said contact hole is between about 0.35 and 0.4 microns.

7. The method of claim 1 wherein said first polysilicon layer deposited to a thickness between about 3,000 and 3,500 microns.

8. The method of claim 1 wherein said layer of O₃TEOS is deposited to a thickness between about 3,000 and 5,000 microns.

9. The method of claim 1 wherein said layer of O₃TEOS is deposited using SACVD at a pressure between about 400 and 500 torr and a temperature between about 350° and 450° C.

10. The method of claim 1 wherein said second polysilicon layer is deposited to a thickness between about 1,000 and 2,000 microns.

11. The method of claim 1 further comprising:

depositing a dielectric layer on said first and second polysilicon layers; and depositing a conductive layer on said dielectric layer, thereby forming a capacitor.

12. The method of claim 11 wherein the dielectric layer is ONO or NO.

13. The method of claim 11 wherein said conductive layer is polysilicon.

14. The method of claim 1 wherein the etchant is 10:1 buffered oxide etch, used at a temperature between about 80° and 120° C.

15. A method for etching a first silicate layer down to the level of a second silicate layer without the use of an intermediate etch stopping layer, comprising:

depositing a layer of BPTEOS on a substrate;

depositing a layer of $O_3$TEOS on said layer of BPTEOS; and etching said layer of $O_3$TEOS using 10:1 buffered oxide etch.

16. The method of claim 15 wherein said layer of BPTEOS is deposited to a thickness between about 2,000 and 3,000 microns.

17. The method of claim 15 wherein said layer of BPTEOS is deposited using SACVD at a pressure between about 180 to 220 torr, a temperature between about 450° to 500° C. and a doping level of boron and phosphorus between about 3 and 5%.

18. The method of claim 15 wherein said layer of $O_3$TEOS is deposited to a thickness between about 3,000 and 5,000 microns.

19. The method of claim 15 wherein said layer of $O_3$TEOS is deposited using SACVD.

* * * * *